(12) United States Patent
Matsumura

(10) Patent No.: US 7,084,657 B2
(45) Date of Patent: Aug. 1, 2006

(54) BUMP AND METHOD OF FORMING BUMP

(75) Inventor: Shigeru Matsumura, Tokyo (JP)

(73) Assignee: Advantest Corporation, Tokyo (JP)

( * ) Notice: Subject to any disclaimer, the term of this patent is extended or adjusted under 35 U.S.C. 154(b) by 52 days.

(21) Appl. No.: 10/345,705

(22) Filed: Jan. 16, 2003

(65) Prior Publication Data

US 2003/0101584 A1    Jun. 5, 2003

Related U.S. Application Data

(62) Division of application No. 09/328,337, filed on Jun. 9, 1999, now abandoned.

(30) Foreign Application Priority Data

Jun. 9, 1998    (JP)    ............................ H10-161191

(51) Int. Cl.
*G01R 1/073* (2006.01)
(52) U.S. Cl. .................. 324/762; 324/754; 324/757
(58) Field of Classification Search ................ 324/754, 324/762, 757
See application file for complete search history.

(56) References Cited

U.S. PATENT DOCUMENTS

| | | | | |
|---|---|---|---|---|
| 4,597,617 A | * | 7/1986 | Enochs ...................... | 439/66 |
| 4,906,920 A | * | 3/1990 | Huff et al. .................. | 324/754 |
| 5,070,297 A | * | 12/1991 | Kwon et al. ................ | 324/754 |
| 5,088,190 A | * | 2/1992 | Malhi et al. ................. | 29/843 |
| 5,090,118 A | * | 2/1992 | Kwon et al. ................. | 29/843 |
| 5,180,977 A | * | 1/1993 | Huff .......................... | 324/754 |
| 5,500,604 A | * | 3/1996 | Swarbrick et al. .......... | 324/754 |
| 5,558,270 A | | 9/1996 | Nachon et al. | |
| 5,623,213 A | * | 4/1997 | Liu et al. .................... | 324/754 |
| 5,984,164 A | * | 11/1999 | Wark ......................... | 228/164 |
| 5,989,936 A | * | 11/1999 | Smith et al. ................ | 438/106 |
| 6,137,297 A | * | 10/2000 | McNair et al. ............. | 324/754 |
| 6,307,392 B1 | * | 10/2001 | Soejima et al. ............. | 324/762 |
| 6,330,744 B1 | * | 12/2001 | Doherty et al. ............. | 29/825 |
| 6,332,270 B1 | * | 12/2001 | Beaman et al. ............. | 29/844 |
| 6,399,474 B1 | * | 6/2002 | Tosaya ....................... | 438/612 |
| 6,462,575 B1 | * | 10/2002 | Cram ......................... | 324/765 |
| 6,476,625 B1 | * | 11/2002 | Do ............................. | 324/755 |
| 6,860,741 B1 | * | 3/2005 | Ashman et al. ............. | 439/70 |

OTHER PUBLICATIONS

German Office Action, Application No. 199 24 239.9-34, dated Dec. 20, 2005 (3 pages).

* cited by examiner

*Primary Examiner*—Ernest Karlsen
(74) *Attorney, Agent, or Firm*—Osha Liang LLP

(57) ABSTRACT

A probe card used for establishing electric contact with an electric part to inspect an electric characteristic thereof comprises a plurality of conductors, each transmitting a signal used for inspection, and a plurality of bumps, each formed on one of the plurality of conductors, which are used for establishing mechanical contact with the electric part. Each bump includes a lower portion fusedly arranged on the conductor and an upper portion taperedly formed in such a fashion that a cross section of the bump closer to a tip thereof is smaller.

9 Claims, 10 Drawing Sheets

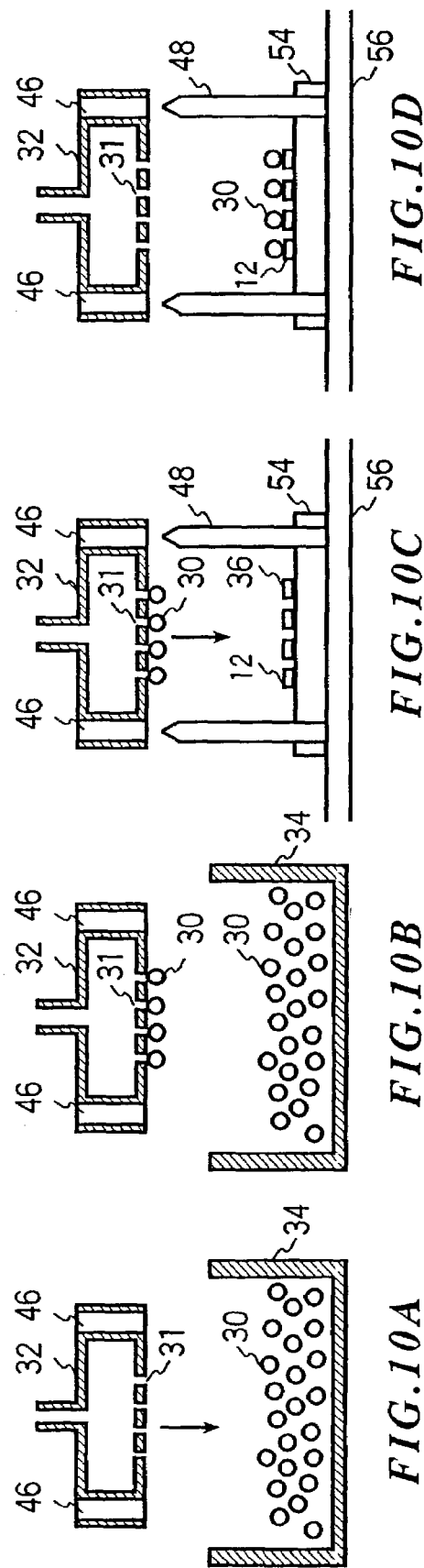

BUMP AND METHOD OF FORMING BUMP

This application is a divisional of U.S. Patent Application Ser. No. 09/328,337, filed Jun. 9, 1999, now abandoned, and claims priority based on a Japanese patent application, H10-161191 filed on Jun. 9, 1998, the contents of which are incorporated herein by reference.

BACKGROUND OF THE INVENTION

1. Field of the Invention

The present invention relates to a bump used for establishing electric contact with an electric part, a probe card that the bump is formed on a conductor, and to a method of forming such a bump. In particular, the present invention relates to a bump and a probe card that a conductive material is fused to or moltenly formed on a conductor.

2. Description of the Related Art

In the February 1996 edition of the magazine *Nikkei Micro-Device* is illustrated a shape of a bump used for keeping in contact with electric parts. Etching and a plating are among the methods used to form such a bump. However, the etching cannot provide all desired shapes. In addition, etching makes it difficult to form a bump accurately according to a specification, requires much time for forming, and has a high cost. Etching is therefore not suitable for mass production applications. Plating, meanwhile, can only provide a bump having a round peripheral portion.

Meanwhile, in the September 1997 edition (p. 168–169) of *M & E* published by Kogyotyosakai was shown a method of forming a bump by moving a soldering ball with a suction instrument. However, this method rounds the shape of the bump when melting a solder, and desirable contact with the electric parts can not be obtained.

Japanese patent publication 2691875 by Okubo et al., registered on Dec. 17, 1997 and published on Aug. 30, 1996, discloses a method of forming a bump using a ball, a melted tip of a wire. This method is also taught in the *Semiconductor Manufacturing Device Dictionary* (Fourth edition, p. 290) edited by Nippon Handotai Seizosouchi Kyokai on Nov. 20, 1997. However, this method requires a number of steps for cutting the tip, and this method cannot make a plurality of bumps of a uniform height.

SUMMARY OF THE INVENTION

In light of the state of the related art as outlined above, it is an object of the present invention to provide a bump and a forming method thereof, which overcomes the above described drawbacks or requirements in the related art. This object is achieved by combinations described in the independent claims. The dependent claims define further advantageous and exemplary combinations of the present invention.

According to a first aspect of the present invention, there is provided a method of forming on a conductor a bump used for electric contact with an electric part, comprising arranging on the conductor a conductive material including a substantially same electric characteristic as the bump by fusing and of forming the arranged conductive material into a desired shape by die pressing with a bump forming die in which a recess having a given shape is defined.

The desired shape may preferably be a tapered shape in which cross sections of the bump closer to its tip tend to be smaller. Further, the tapered shape is preferably a conical shape.

The forming may preferably include retaining a distance between the conductor and a peripheral portion of the recess larger than half of a depth of the recess.

The bump forming die may preferably include in a peripheral portion of the recess, a concave shallower than the recess to prevent a surplus of the conductive material from expanding.

The forming may preferably include plating the formed bump with a high-hardness material having a hardness higher than the conductive material. Further, it may be preferable for the high-hardness material to comprise one metal from the set composed of nickel and palladium nickel. Similarly, the method may preferably comprise plating the plated bump with gold.

In the method, the arranging may preferably include fusing a tip of a wire having a substantially same electric characteristic as the conductive material by discharging; positioning the fused tip on the conductor; holding the wire with the tip being in contact with the conductor for a given period of time to arrange the tip on the conductor; and cutting the wire with the tip remaining on the conductor by separating the wire from the conductor.

In the method, the arranging may preferably include transferring a ball-shaped material having the conductive material onto the conductor by sucking; fusing the transferred ball-shaped material by reflowing; and solidifying the fused ball-shaped material by cooling.

According to another aspect of the present invention, there is provided a bump formed on a conductor used for electric contact with an electric part, comprising a lower portion fusedly arranged on the conductor and an upper portion taperedly formed by die pressing in such a fashion that a cross section of the bump closer to a tip thereof is smaller.

The tapered shape may preferably be a conical shape.

The upper portion may preferably have a length larger than 20 microns.

It may further be preferable for the bump to be plated with a high-hardness material having a hardness higher than the upper portion. Further, the high-hardness material has one of nickel and palladium nickel. The high-hardness material on the bump is also preferably plated with gold.

According to a still further aspect of the present invention, there is provided a probe card used for establishing electric contact with an electric part to inspect an electric characteristic thereof, comprising a plurality of conductors each transmitting a signal used for inspection, and a plurality of bumps each formed on one of the plurality of conductors used for establishing mechanical contact with the electric part, wherein each bump includes a lower portion fusedly arranged on the conductor and an upper portion taperedly formed in such a fashion that a cross section of the bump closer to a tip thereof is smaller.

It may be preferable for the probe card to comprise a plurality of elastic members each pressing one of the plurality of bumps to the electric part. Further, the probe card may preferably comprise a flexible board on which the conductors are arranged, wherein the flexible board is pressed by the elastic body to allow the bumps on the conductors to come in contact with the electric part. Similarly, in the probe card, the elastic members may preferably be arranged for the plurality of conductors, respectively.

It may be preferable for the conductors to be unified with the respective elastic members.

The tapered shape may preferably be a conical shape.

The bumps may preferably be formed to have a uniform height by die pressing.

The upper portion of the bump may preferably be more than 20 microns in height.

The bump may preferably be plated with a high-hardness material having a hardness larger than the upper portion.

This summary of the invention does not necessarily describe all necessary features and the invention may also be a combination of these separately described features.

BRIEF DESCRIPTION OF THE DRAWINGS

FIGS. 10A–10D illustrate the process of forming bumps using ball-shaped materials 30.

DETAILED DESCRIPTION OF THE INVENTION

The present invention will now be described based on preferred embodiments, which do not intend to limit the scope of the present invention, but exemplify the invention. Not all features or their combinations described below are essential to the invention.

FIRST EMBODIMENT

A first embodiment of the probe card of flexible board type according to the present invention will now be described.

Figure 1:
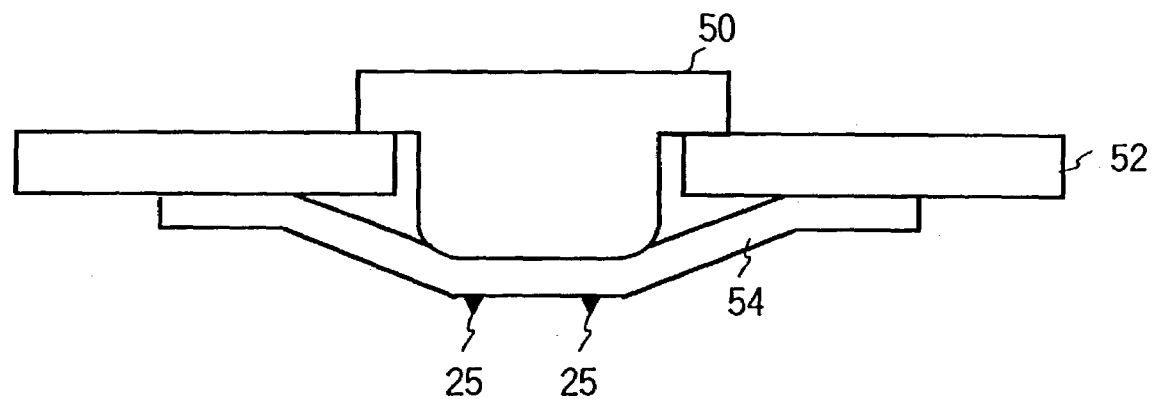
FIG. 1 shows a cross sectional view of the probe card.

FIG. 1 shows a cross sectional view of the probe card. The probe card includes a printed board 52, a flexible board 54, an elastic body 50, and a plurality of bumps 25. Around the center of the printed board 52, an opening portion is defined. The flexible board 54 is arranged on the bottom side of the printed board 52 to cover the opening portion. The elastic body 50 presses the top side of the flexible board 54 through the opening portion. The bumps 25 are formed on the bottom side of the flexible board 54. Hence, the bumps 25 can maintain electrical contact with electric parts to be used to inspect the electric characteristics of such parts.

Figure 2:
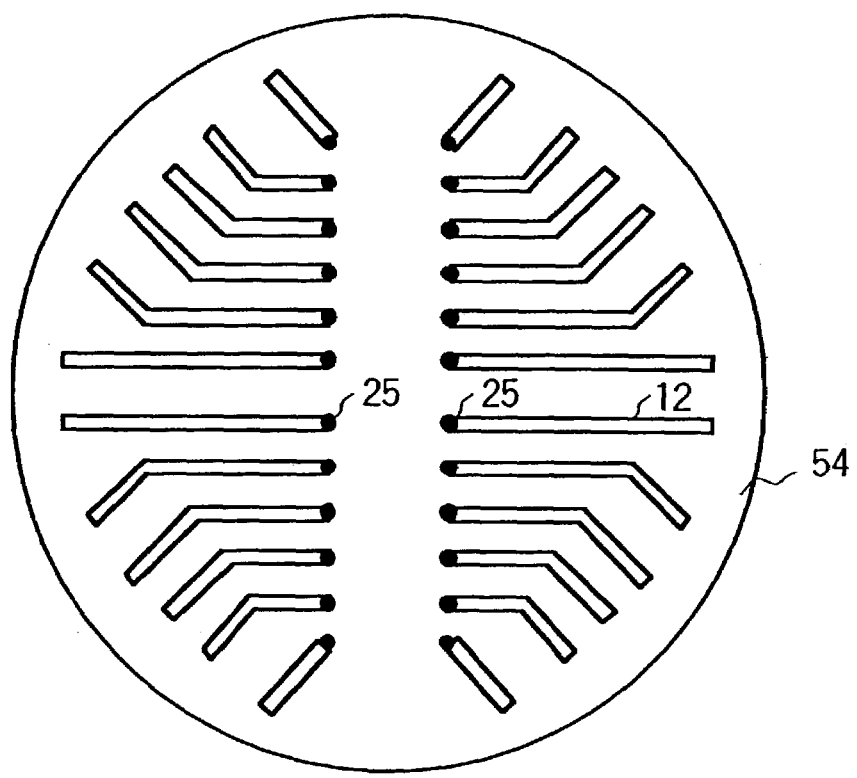
FIG. 2 shows the bottom view of a flexible board 54 of FIG. 1.

FIG. 2 shows the bottom view of the flexible board 54 of FIG. 1. In the figure, the flexible board 54 includes a plurality of conductors 12, each of which serves to transmit to and receive from the corresponding bump 25 an electric signal used for testing the electric characteristics. The bumps 25 are formed at the top of the conductors 12 by arranging molten wire including dielectric material on respective conductors 12.

Figure 3B:
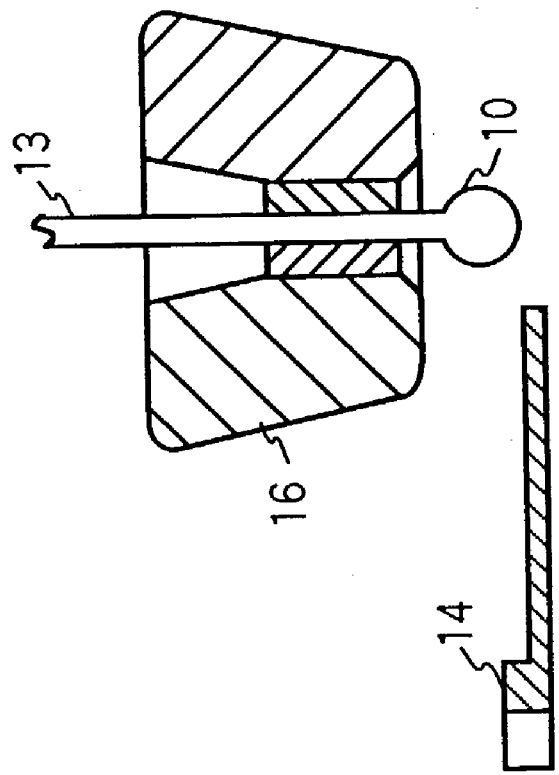
FIGS. 3a and 3b show the process of melting the tip of a wire used for forming a bump 25.
Figure 3A:
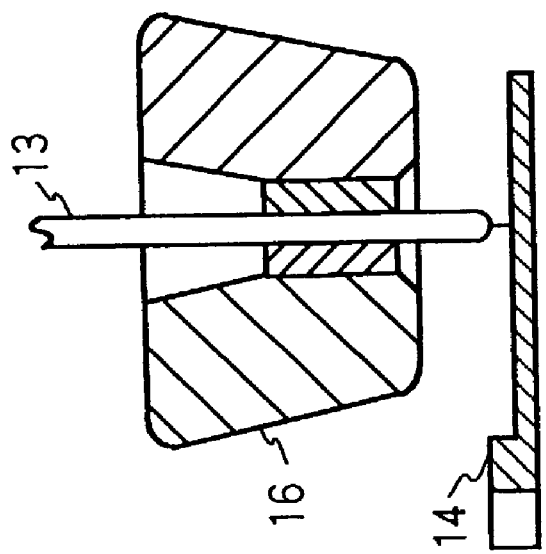

FIG. 3 illustrates a process of melting the tip of a wire used for forming a bump 25. The wire 13 includes conductive material such as gold, aluminum, and copper. First, as shown in FIG. 3A, the wire 13 is protruded a little from the bottom side of the capillary 16 which is a part of the bonding machine (not shown), thereby being held by the capillary 16. Next an end of the wire 13 is fused or melted through electronic spark caused by discharging between the wire 13 and the electric torch 14. Then, as shown in FIG. 3B, the melted wire 13 is rounded by surface-tension, whereby a ball 10 is formed at the tip of wire 13. Thereafter, the electric torch 14 is removed from the ball 10.

Figure 4B:
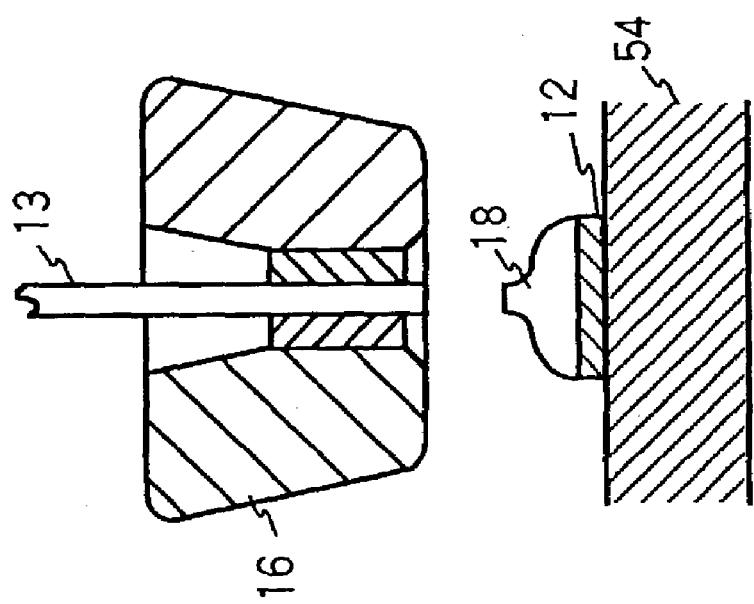
FIG. 4A illustrates the process of allowing a ball 10 to maintain contact with a conductor 12 on the flexible board 54 and FIG. 4B shows the process of cutting the bump base 18.
Figure 4A:
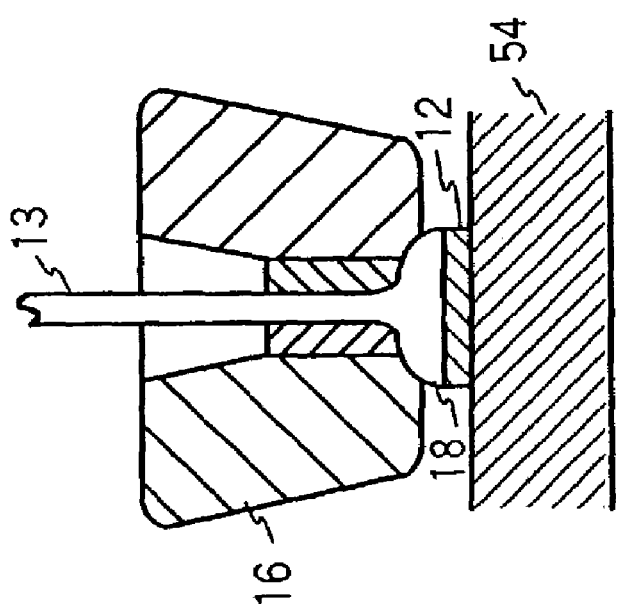

FIG. 4A shows the ball 10 being kept in contact with a conductor 12 on the flexible board 54, while FIG. 4B shows the process of cutting the bump base 18. In FIG. 4A, the capillary 16 descends toward the flexible board 54, thereby causing the ball 10 to come into contact with the conductor 12. Next, the ball 10 is deformed to be a bump base 18. Further, being held by the concave of the capillary 16 facing to the bump base 18, the bump base 18 is fusedly arranged on the conductor 12. To solidify the bump base 18 through cooling, the wire 13 stays at the same position for a given period of time, with the bump base 18 pressed onto the conductor 12.

As shown in FIG. 4B, the wire 13 is moved away from the conductor 12, whereby the wire 13 is cut to leave the bump base 18 on the conductor 12. For example, the wire 13 is transferred upward from the conductor 12 by supporting with the capillary 16.

Figure 5A:
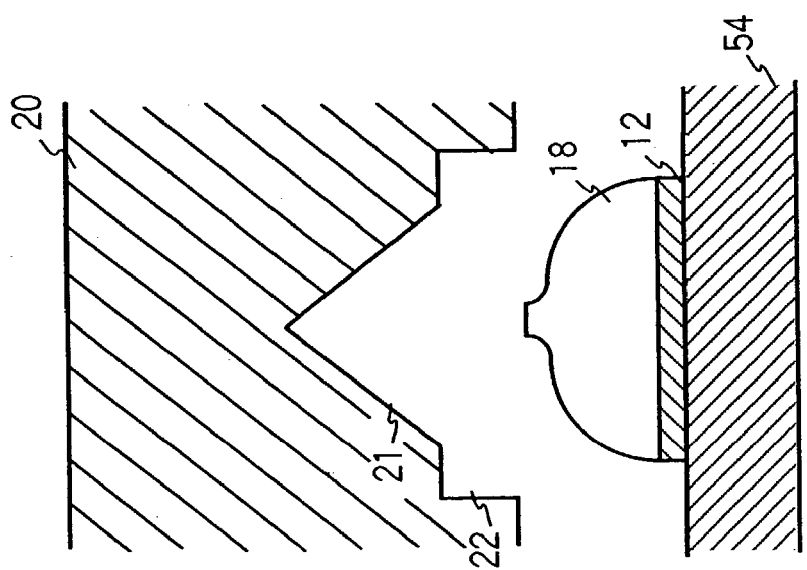
FIGS. 5A–5C illustrates a processes of forming the bump base 18 using a bump forming die 20.
Figure 5B:
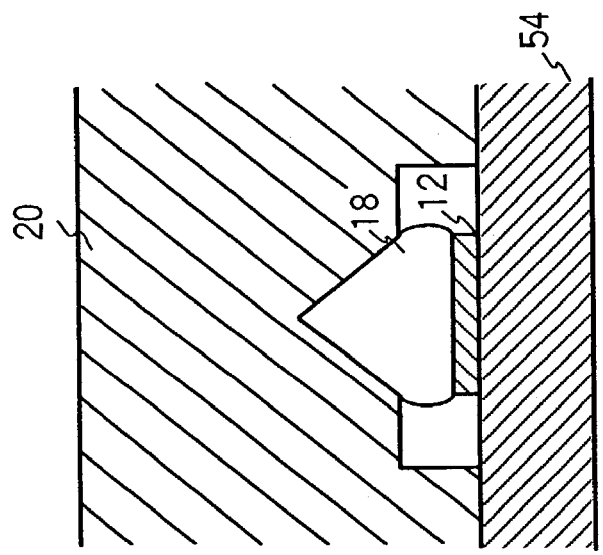
Figure 5C:
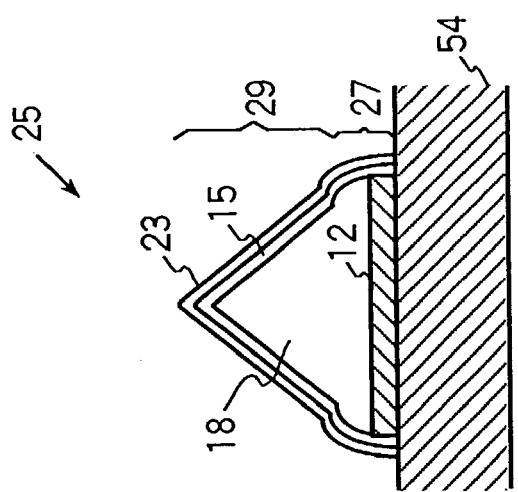

FIGS. 5A–5C show the processes of forming the bump base 18 using the bump forming die 20. The bump forming die 20 is preferably made from SK material or the like having a hardness beyond that of the SK material. In FIG. 5A, a recess 21 has been formed in the bump forming die 20. The recess 21 shapes the bump base 18 by pressing the bump base 18. In addition to the recess 21, in the bump forming die 20, a concave depression 22 whose depth is smaller than that of the recess 21 has been formed around the recess 21. The concave depression 22 prevents the recess 21 from approaching the conductor 12 too closely.

As shown in FIG. 5B, most of the bump base 18 comes in contact with the recess 21. However, a portion of the bump base 18 does not come in contact with the recess 21, in other words, a surplus of the bump base 18 overflows into the concave depression 22. Such a surplus might come into contact with a bump base and a conductor (not shown) adjacent to the bump base 18 and the conductor 12. To prevent this undesirable contact, it is preferable to keep the distance between the conductor 12 and the peripheral portion of the recess 21 larger than a given distance. In other word, it is preferable not to allow the conductor 12 to approach the recess 21 beyond necessity. For example, the depth of the concave depression 22 is set in such a fashion that the distance is longer than ½ of the depth of the recess 21, that is to say, ⅓ of the height of the bump base 18. More preferably, the depth of the concave depression 22 is set in such a way that the distance is longer than 40% of the height of the bump base 18. In this embodiment, the height of the bump base 18 is set 40 um (microns) while the distance is set 20 um, half of the height of the bump base 18. The bump forming die 20 is halted pressing the bump base 18 for approximately 10 ms (milliseconds), to form the bump base 18.

FIG. 5C shows the bump base 18 after it has been prepared through press forming. In the figure, the bump base 18 includes a lower portion 27 and an upper portion 29. The lower portion 27 is fusedly arranged on the conductor 12.

The upper portion 29 has such a shape that the cross section closer to the top of the bump 25 is smaller, for example, is shaped to be like a circular cone. To enhance the hardness, the bump base 18 is plated with high-hardness material, such as nickel or palladium-nickel, which have a hardness higher than that of the bump base 18. To improve the electric contact with electric parts, the high-hardness material 15 is plated with gold 23, which allows the length of the upper portion 29 to be more than 20 um.

Figure 6:
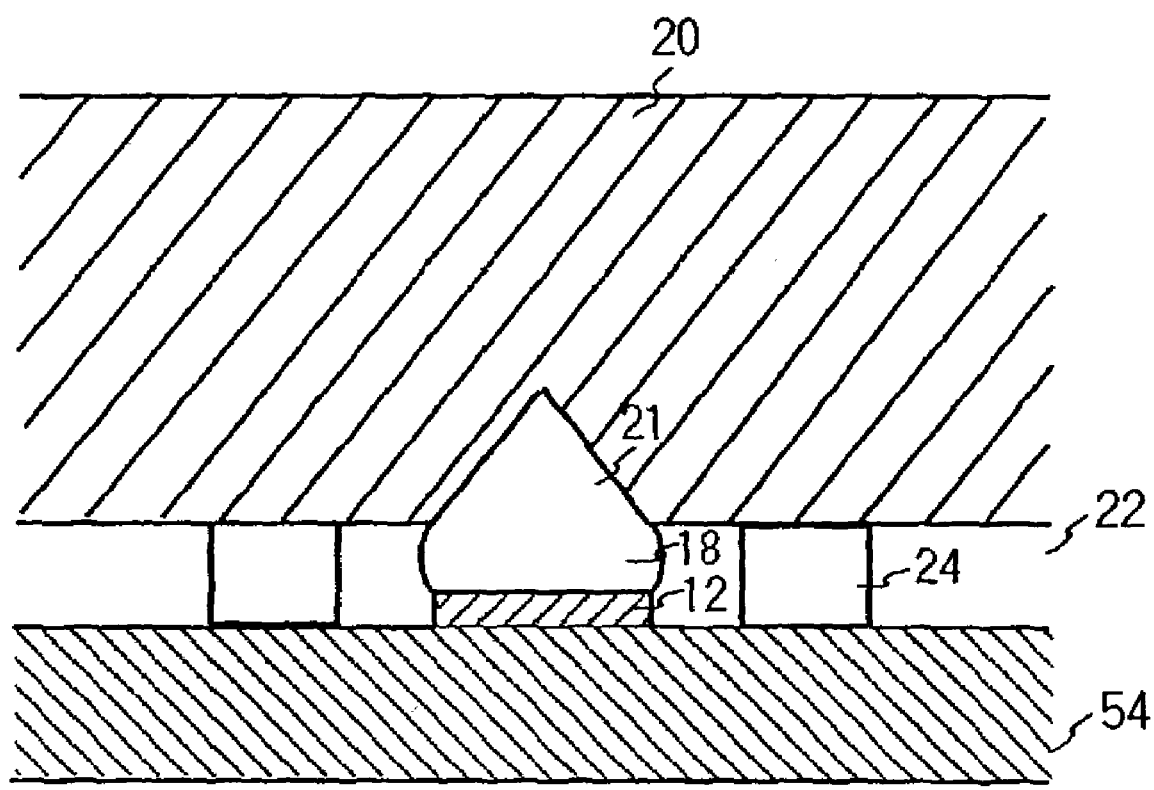
FIG. 6 shows another example of a concave depression 22 of the bump forming die 20.

FIG. 6 shows another example of the concave depression 22 of the bump forming die 20 of FIG. 5. Arranging the supports 24 in the bump forming die 20 ensures a given distance between the peripheral portion of the recess 21 and the conductor 12. It is possible to arrange one support 24 for each recess 21 and also to arrange one support 24 for a plurality of recesses 21. The supports 24 yields a concave depression 22 around the recess 21, in which the concave depression 22 prevents the surplus of the bump base 18 overflowing out of the recess 21 from coming in contact with a bump base or a conductor (not shown) adjacent to the bump base 18.

Figure 7:
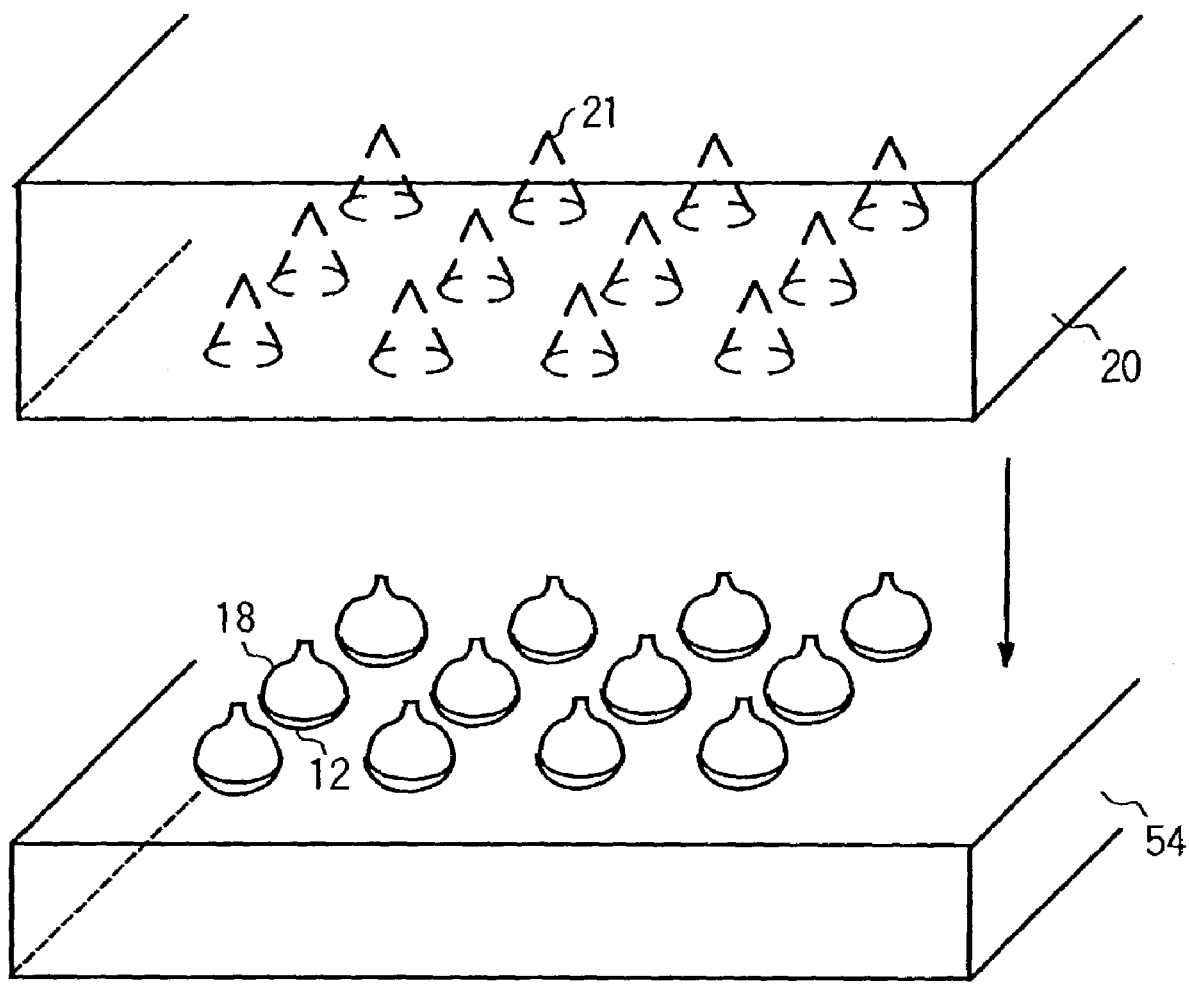
FIG. 7 illustrates a process of forming the bumps 25.

FIG. 7 illustrates the process of forming the bumps 25 like a lattice or checked pattern. First, on the flexible board 54 are arranged the conductors 12 like a checked pattern, wherein each of the bump bases 18 is arranged onto the corresponding conductor 12. Next, the bump forming die 20, in which a plurality of recesses 21 are defined like a checked pattern, is pressed to the bump bases 18, which shapes each bump base 18 into a desirable form.

Figure 8:
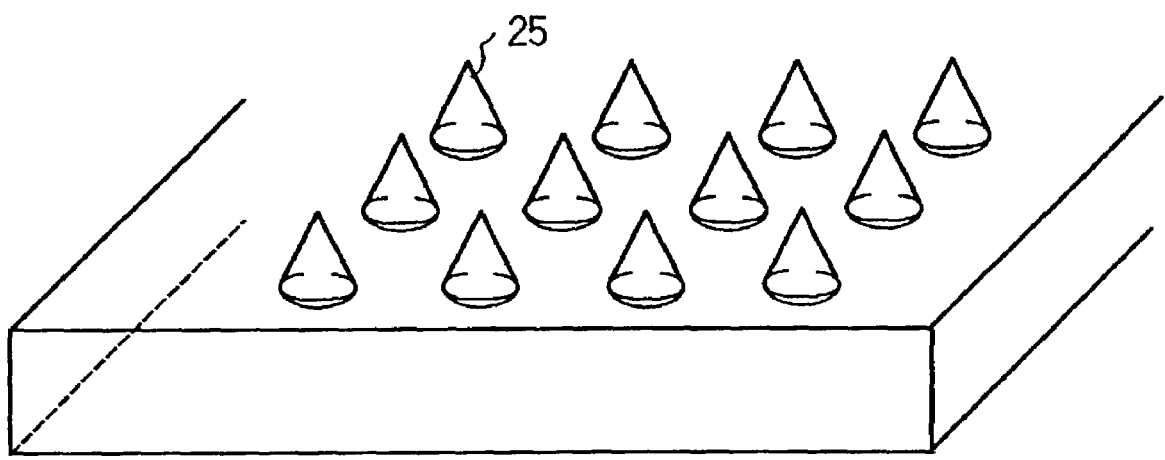
FIG. 8 shows the bumps 25 formed through the forming process of FIG. 7.

FIG. 8 shows the bumps 25 formed like a checked pattern through the forming process of FIG. 7. The conical bumps 25 are formed by the corresponding recesses 21 arranged in the bump forming die 20. In accordance with this embodiment, pressing the forming die 20 with the recesses 21 arranged like a checked pattern to the bump bases 18 once can unify the height of the bumps.

SECOND EMBODIMENT

A second embodiment of the present invention in the form of a process of forming a bump according to the present invention is described in the following. While in the first embodiment, the bump base 18 is formed by melting the tip of the wire 13, in the second embodiment, ball-shaped material including conductive material is prepared in advance, and the bump base 18 is formed by fusedly arranging the ball-shaped material on the conductor 12.

Figure 9B:
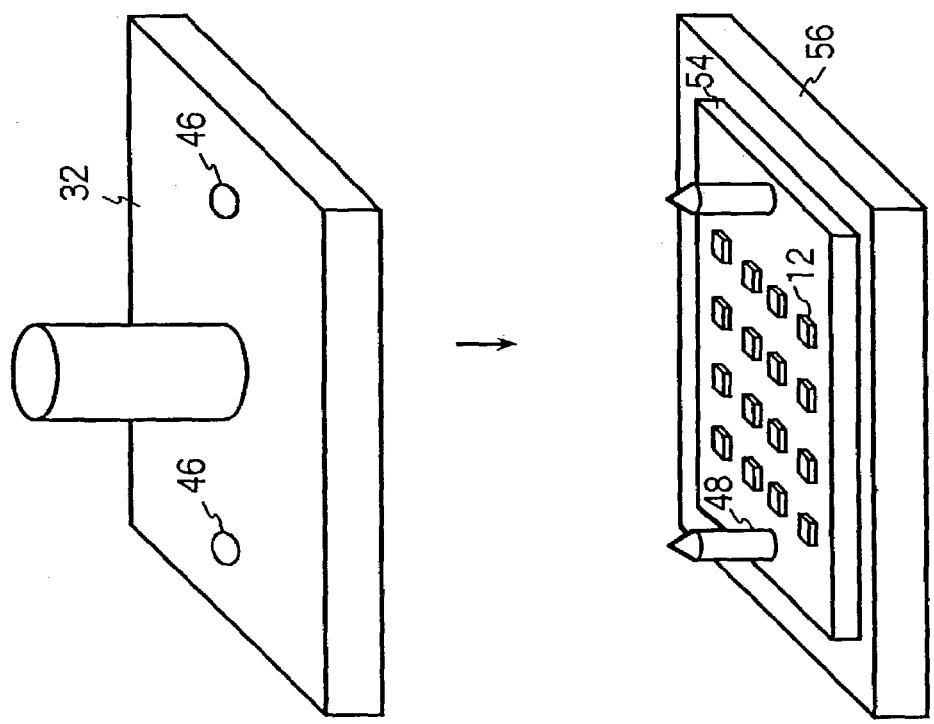
FIGS. 9A and 9B are perspective views of a container 34 and a suction instrument 32.
Figure 9A:
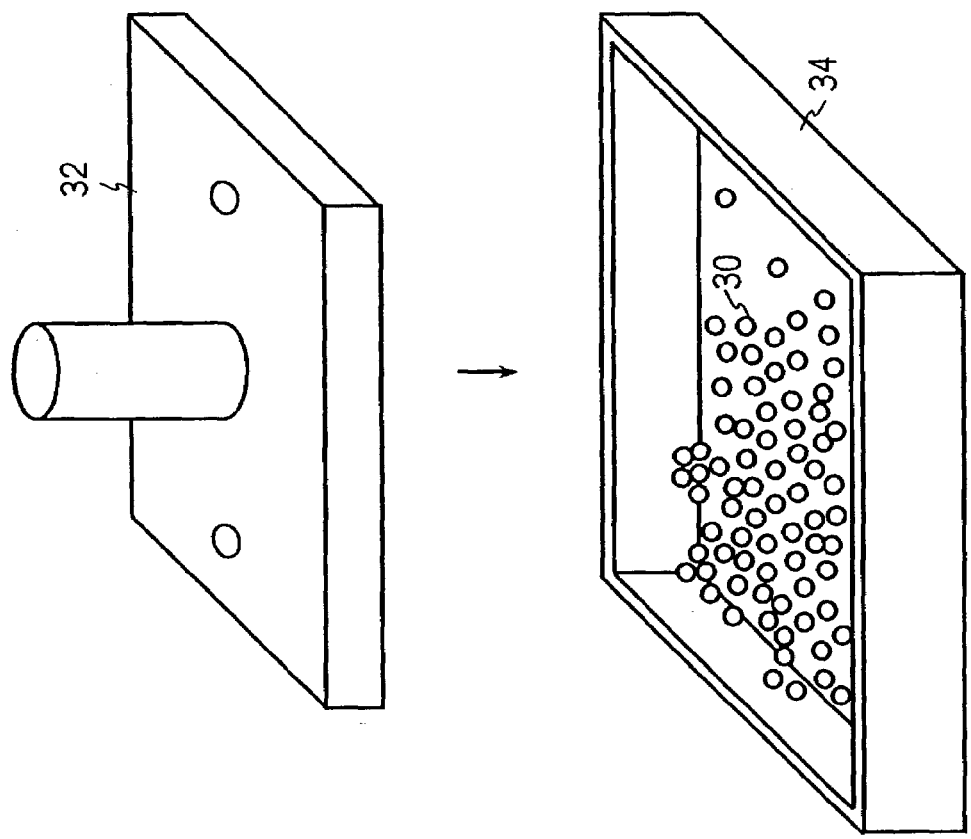

FIGS. 9A and 9B are perspective views which show the container 34 and the suction instrument 32. In the figures, the container 34 contains the ball-shaped materials 30 including conductive material. Specifically, the ball-shaped materials 30 are made from conductive material such as copper or gold suitable for plasticity forming. The ball-shaped materials 30 are transferred onto the stand 56 by the suction instrument 32 using suction. On the stand 56 have been arranged two guidance bars 48 for positioning, while in the flexible board 54 have been defined two holes corresponding to the guidance bars 48, in which the flexible board 54 is positioned on the stand 56 and guided by the guidance bars 48. Similarly, the guidance holes 46 are formed in the suction instrument 32, wherein inserting the guidance bars 48 into the guidance holes 46 positions the suction instrument 32 on the stand 56.

FIG. 10A is a cross sectional view of the container 34 and the suction instrument 32 of FIG. 9A, FIG. 10B shows the suction instrument 32 that the ball-shaped materials 30 are held on the bottom side of the suction instrument 32 through sucking via the suction holes 30, FIG. 10C shows the suction instrument 32 which positions the ball-shaped materials 30 on the conductors 12, and FIG. 10D shows the conductors 12 on which the ball-shaped materials 30 are arranged.

In the bottom side of the suction instrument 32 are defined a plurality of suction holes 31. The positions of the suction holes 31 correspond to those of the conductors 12 on the flexible board 54. To provide electric conductivity and mechanical strength between the ball-shaped materials 30 and the conductors 12, a conductive adhesive such as solder paste or flux is applied to the surface of each conductor 12. By lowering the suction instrument 32 in the direction indicated in the figure by an arrow, each ball-shaped material 30 is sucked towards a suction hole 31. The guidance holes 46 are moved to face the guidance bars 48, whereby the ball-shaped materials 30 are released from the suction instrument 32 toward the conductors 12. After being arranged on the conductors 12, the ball-shaped materials 30 experiences reflowing to be fixed on the conductors 12. Similar to the first embodiment, pressing the bump forming die 20 toward the flexible board 54 yields a bump having a sharp tip, detail of which is similar to that of the first embodiment.

According to the second embodiment, because the plurality of ball-shaped materials 30 are simultaneously arranged onto the conductors 12, a large number of ball-shaped materials can be formed more rapidly than the case with the first embodiment.

THIRD EMBODIMENT

A probe card according to the present invention will now be described as a third preferred embodiment of the present invention.

Figure 11:
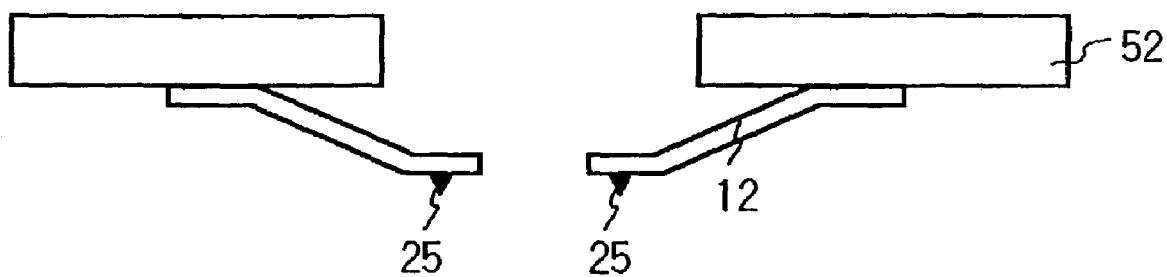
FIG. 11 shows a probe card of metal probe type according to one embodiment of the present invention.

FIG. 11 shows the embodiment of a probe card of metal probe type. While the first and second embodiments the conductors 12 are arranged on the flexible board 54, in the third embodiment, the conductors 12 are directly arranged on the printed circuit board 52. The conductors 12 of the third embodiment are also thicker than those of the first and second embodiments, which enlarges the spring modulus with respect to bending. That is, the thickness of the conductors 12 enables the conductors 12 to serves as elastic member. Accordingly, the bumps 25 can keep strong contact with electric parts by the elasticity of the conductors 12. Even though being directly arranged on the printed circuit board 52, the bumps 25 can be formed through the same method as those of the first and second embodiments.

As described above, in accordance with the present invention, the bumps and the probe cards used for electric contact with electric parts can be formed accurately and quickly.

Although the present invention has been described by way of exemplary embodiments, it should be understood that many changes and substitutions may be made by those skilled in the art without departing from the spirit and the scope of the present invention which is defined only by the appended claims.

What is claimed is:

1. A probe card used for establishing electric contact with an electric part to inspect an electric characteristic thereof, comprising:

a plurality of conductors each transmitting a signal used for inspection; and a plurality of bumps each formed on one of the plurality of conductors used for establishing mechanical contact with said electric part, wherein each bump includes a lower portion fusedly arranged on said conductor and an upper portion taperedly formed in such a fashion that a cross section of said bump closer to a tip thereof is smaller than a cross section further from said tip, wherein said plurality of conductors comprise a plurality of elastic members, each pressing one of said plurality of bumps to said electric part, and wherein said plurality of bumps are shaped with a die.

2. A probe card as set forth in claim 1, further comprising a plurality of elastic members each pressing one of said plurality of bumps to said electric part.

3. A probe card as set forth in claim 2, further comprising a flexible board on which said conductors are arranged;

wherein said flexible board is pressed by an elastic body to allow said bumps on said conductors to come in contact with said electric part.

4. A probe card as set forth in claim 2, wherein said elastic members are arranged for said plurality of conductors, respectively.

5. A probe card as set forth in claim 4, wherein said conductors are unified with said respective elastic members.

6. A probe card as set forth in claim 1, wherein said tapered shape is a conical shape.

7. A probe card as set forth in claim 1, wherein said bumps are formed to have a uniform height by die pressing.

8. A probe card as set forth in claim 1, wherein said upper portion of said bump is more than 20 microns in height.

9. A probe card as set forth in claim 1, wherein said bump is plated with a hard material having a hardness higher than that of said upper portion.

* * * * *